United States Patent [19]

Price et al.

[11] Patent Number: 4,870,245
[45] Date of Patent: Sep. 26, 1989

[54] PLASMA ENHANCED THERMAL TREATMENT APPARATUS

[75] Inventors: J. B. Price, Scottsdale, Ariz.; Edwin E. Reed, Pflugerville, Tex.; James L. Rutledge, Tempe, Ariz.

[73] Assignee: Motorola, Inc., Schaumburg, Ill.

[21] Appl. No.: 718,751

[22] Filed: Apr. 1, 1985

[51] Int. Cl.$^4$ .............................................. B23K 9/00
[52] U.S. Cl. ........................... 219/121.36; 219/121.40; 219/121.43; 156/646; 156/345; 204/192.1
[58] Field of Search ...... 217/121 P, 121 PD, 121 PE, 217/121 PG, 121 PF; 156/643, 345, 646; 204/192 E, 192 N; 427/34, 39

[56] References Cited

U.S. PATENT DOCUMENTS

| | | | |
|---|---|---|---|
| 4,115,184 | 9/1978 | Poulsen | 219/121 PG |
| 4,253,907 | 3/1981 | Parry et al. | 219/121 PG |
| 4,430,547 | 2/1984 | Yoneda et al. | 219/121 PG |
| 4,547,648 | 10/1985 | Longeway | 219/121 PG |
| 4,550,239 | 10/1985 | Vehara et al. | 219/121 PD |

OTHER PUBLICATIONS

IBM Technical Disclosure Bulletin, vol. 25, No. 10, 3-1983, by Stein.

Primary Examiner—M. H. Paschall
Attorney, Agent, or Firm—Joe E. Barbee

[57] ABSTRACT

Apparatus for the nitridiation of a silicon-bearing substrate is disclosed. The apparatus includes a double walled reaction vessel having first and second concentric walls bounding a reaction volume. Temperature of the reaction volume is controlled by resistance heaters located outside the outermost of the two concentric tubes. Plasma electrodes are positioned about the reaction volume and between the two concentric tubes. The ambient between the two tubes is controlled to protect the electrodes from oxidation at the high temperatures to which they are exposed. An rf generator is coupled to the plasma electrodes and is controllable independently from the resistance heaters.

21 Claims, 2 Drawing Sheets

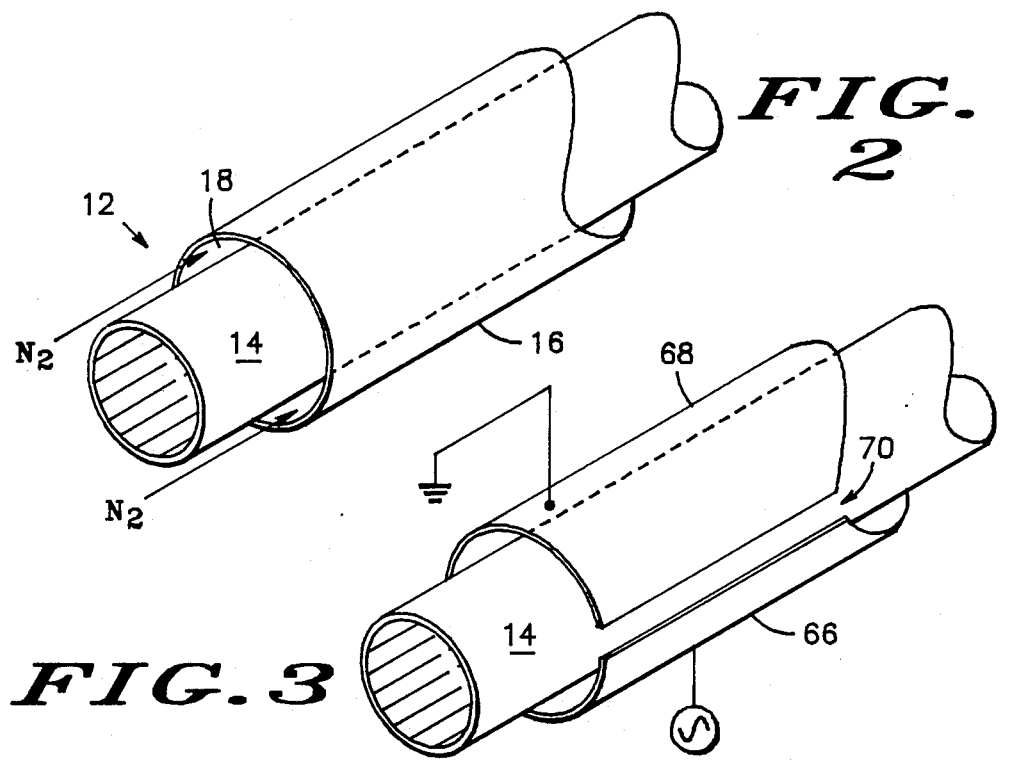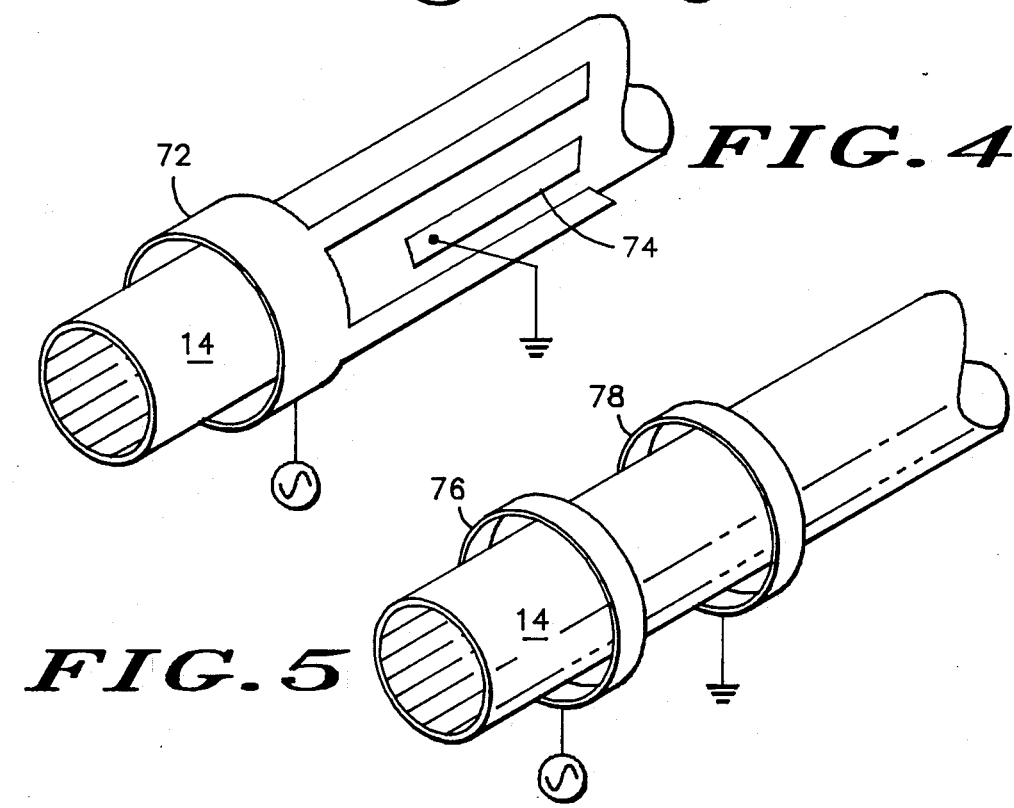

PLASMA ENHANCED THERMAL TREATMENT APPARATUS

BACKGROUND OF THE INVENTION

This invention relates generally to apparatus for the plasma enhanced thermal treatment of a material, and more specifically to apparatus for the plasma assisted thermal nitridation of silicon-bearing materials in which the plasma generation and thermal heating are independently controlled.

In certain applications in which an object such as a semiconductor device is subjected to a high temperature thermal treatment it has been found that the high temperature reaction is advantageously enhanced by simultaneous treatment with an rf plasma. For example, in the nitridation of a silicon surface by subjecting the surface to nitrogen bearing reactants at an elevated temperature, the nitridation process is improved by subjecting the reactants to an rf plasma in addition to the high temperature. By combining the rf plasma with the thermal treatment, the necessary temperature for the reaction can be reduced and the quality of the resulting silicon nitride film can be improved.

There have been a number of attempts to enhance high temperature thermal processing by the addition of plasma energy. For example, as is illustrated in U.S. Pat. No. 4,448,633, a plasma is generated outside a heated furnace and then that plasma is carried into the heated reaction zone. By the application of rf energy to plasma electrodes in the form of either an induction coil or capacitive means, an rf plasma is generated. Gaseous reactants in the presence of this plasma are raised to excited states and the reactant plasma species then flow into the heated reaction chamber where they react with a heated substrate. The reaction is the result of the combination of the high temperature environment and the excited plasma species. Although such a reaction can be efficiently utilized for growing films, or the like, on a small number of substrates, the process does not extend to the uniform formation of films on a large number of substrates. The plasma generated species have a finite lifetime; the further the plasma must travel from the location at which it is generated to the location at which it reacts with a heated substrate, the more dilute the concentration of plasma species. If a large number of substrates are to be processed, the plasma reactants may have to flow a considerable distance from the point at which they are generated. Those substrates closest to the plasma generation thus see a higher concentration of plasma species than do substrates located more distant from the plasma generation site. The non-uniformity of the plasma concentration across a number of substrates causes non-uniformity from one substrate to the next.

In order to overcome the plasma depletion effects, a number of attempts have been made to generate the plasma at the site of the heated reaction zone. For example, in U.S. Pat. No. 4,151,058, a hydrogen plasma is generated by an rf coil surrounding a reaction tube and the substrates to be acted upon. Heat for the reaction is provided by an adjacent radiant heat source. In other attempts to generate an in situ plasma, for example as illustrated in U.S. Pat. Nos. 4,298,629 and 4,486,461, a plasma is generated by an rf coil surrounding the reaction chamber. This same rf coil is also the source of heat for the reaction. In U.S. Pat. No. 4,298,629, the high temperature is achieved by induction heating a susceptor upon which the substrate rests. In U.S. Pat. No. 4,486,461 the high temperature is generated by induction heating a heater coil wrapped around the reaction zone. In each case the induction heating is accomplished by the same rf source which generates the plasma. In each of these attempts to overcome the plasma depletion effects, control of the reaction parameters is severely limited. Using a single energy source, for example, prevents the independent adjustment of plasma energy and temperature. Use of a radiant heat source provides less than the desired control of temperature.

In view of the foregoing, a need existed for processing apparatus which would provide the necessary control of processing parameters and overcome the deficiencies of the existing equipment.

It is therefore an object of this invention to provide an improved apparatus for the plasma enhanced thermal processing of silicon-bearing substrates.

It is another object of this invention to provide improved plasma enhanced thermal processing equipment having independent control of temperature and plasma parameters.

It is a further object of this invention to provide improved apparatus for the plasma enhanced treatment of semiconductor device substrates.

It is a still further object of this invention to provide improved apparatus for plasma enhanced thermal processing having means for protecting plasma electrodes from degradation at the reaction temperature.

It is yet another object of this invention to provide improved apparatus for the plasma enhanced thermal nitridation of semiconductor substrates.

It is another object of this invention to provide an improved process for the plasma enhanced in situ etching and subsequent thermally processing of a substrate.

BRIEF SUMMARY OF THE INVENTION

The foregoing and other objects and advantages of the invention are achieved through an improved plasma enhanced thermal process apparatus and its use. The apparatus includes a double walled reaction vessel having first and second concentric walls which bound a reaction volume. A resistance heater is positioned about the reaction volume and exterior to the reaction vessel to heat material placed within the reaction volume. Plasma generating electrodes are positioned between the first and second walls for generating a plasma within the reaction volume. The resistance heaters and the plasma electrodes are independently energized so that the reaction temperature and the plasma density can be independently controlled.

BRIEF DESCRIPTION OF THE DRAWINGS

FIG. 2 illustrates, in perspective view, a double walled reaction vessel in accordance with the invention; and FIGS. 3-5 illustrate plasma electrode configurations in accordance with various embodiments of the invention.

DETAILED DESCRIPTION OF PREFERRED EMBODIMENTS

Figure 1:
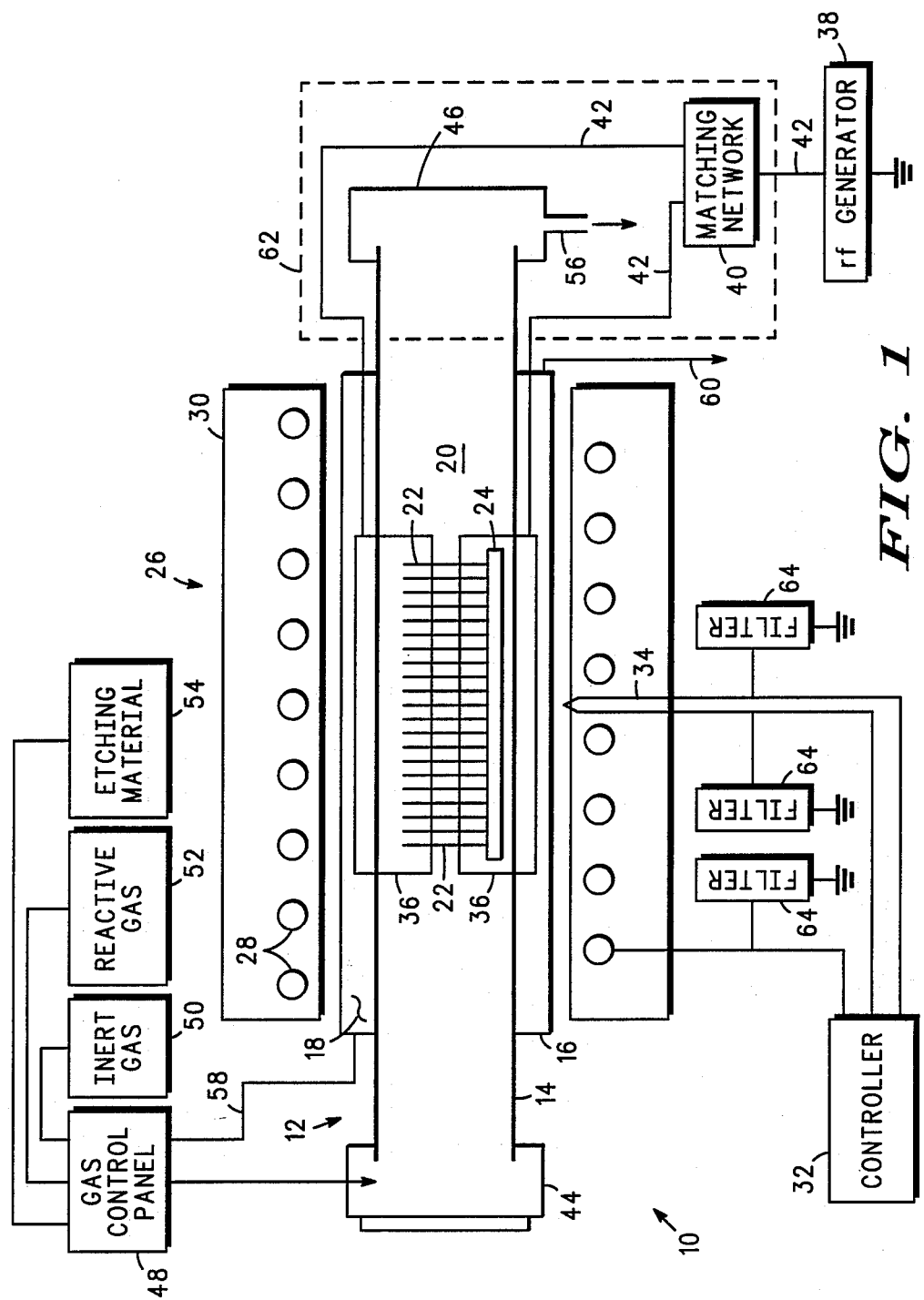
FIG. 1 illustrates, in cross section, a plasma enhanced thermal processing reactor in accordance with one embodiment of the invention.

FIG. 1 illustrates, in cross section, plasma enhanced thermal processing apparatus 10 in accordance with a preferred embodiment of the invention. The apparatus is described and illustrated with reference to a specific plasma enhanced thermal process, namely the plasma enhanced thermal nitridation of a silicon-bearing substrate. The invention is not to be limited, however, to these illustrative embodiments since the equipment, with appropriate modifications, is equally applicable to other plasma enhanced thermal processes including, for example, plasma enhanced in situ etching, plasma enhanced chemical vapor deposition, plasma enhanced epitaxial growth, plasma enhanced thermal oxidation, and the like.

Processing apparatus 10 includes a double walled reaction vessel 12. The reaction vessel, which can be of quartz or the like, is a double walled vessel including an inner tube 14 and an outer tube 16. Tube 16 is concentric with tube 14 with a space 18 between the two tubes. Tubes 14 and 16 are preferably cylindrical tubes having a circular cross section. The inner tube 14 bounds a reaction volume 20 in which a plurality of substrates 22 can be positioned. In a preferred embodiment the substrates 22 stand upright in a boat or carrier 24. Reaction vessel 12 is positioned within a resistance heated furnace 26. The furnace includes furnace windings 28 or other resistance heating means such as heating rods or the like. The heating means are contained within a thermally insulated enclosure 30. Power is supplied to heating means 28 through an automated controller 32. One or more thermocouples 34 measure the temperature in the reaction volume. Feedback from the thermocouples to the controller is used to maintain the temperature of the reaction volume at the desired value.

Positioned between the inner tube 14 and outer tube 16, in accordance with the invention, are plasma electrodes 36. In a preferred embodiment of the invention, plasma electrodes 36 are semi-cylindrical in shape, concentric with the double walled reaction vessel, and substantially surround the reaction volume 20. Electrodes 36 are coupled to an rf generator 38 through a matching network 40. Coaxial cables 42, or the like, interconnect the generator, matching network, and electrodes. By controlling the rf generator and the matching network, the power delivered to the plasma electrodes and thus the intensity of the plasma generated in the reaction volume is controlled. The rf generator preferably operates at 13.56 MHz in accordance with FCC standards, but other frequencies can also be used. Control of the rf generator is completely independent of controller 32 and the power supplied to the resistance heaters 28.

End caps 44, 46 enclose the input and output ends, respectively, of inner tube 14 to allow control of the ambient within that tube. A gas panel 48 controls the flow of reactants from reactant sources 50, 52, 54 to feedthroughs in end cap 44. Depending on the reaction to be carried out in the apparatus, the reactant sources 50, 52, 54 can be, for example, an inert gas such as helium or argon, reactive gases such as ammonia, nitrogen, oxygen, silane, and the like, and etching materials such as hydrogen chloride, $CF_4$, $SF_6$, and $NF_3$. Reactants flow from the end cap 44 through the reaction volume 20 and are exhausted through end cap 46. Reaction products are exhausted through a feedthrough 56 to a vacuum pump (not shown). The vacuum pump maintains the desired pressure within the reaction volume. An inert gas such as nitrogen also flows from gas panel 48 through a tube 58 to the space 18 between the inner and outer tubes. The inert gas flows past the plasma electrodes 36 to prevent oxidation of those electrodes at the reaction temperature to which they are exposed. The nitrogen flows out of the space 18 through an exhaust 60. In this context, an inert gas is one which is substantially non-reactive with the plasma electrodes.

Interference between the rf circuitry and the power supply for the resistance heaters is minimized by placing a screen 62 around the most sensitive of the rf components. In addition, low pass filters schematically indicated at 64 protect the control circuitry and resistance heaters from rf interference. The filters can be, for example, by-pass capacitors.

FIG. 2 illustrates, in perspective view, a preferred embodiment of the reactor vessel 12. The vessel includes inner 14 and outer 16 cylindrical quartz tubes of circular cross section. The tubes are concentric, with a space 18 between the two tubes. The plasma electrodes (not shown in this illustration) are positioned in the space between the tubes. To reduce oxidation of the electrodes, an inert gas such as nitrogen flows in space 18.

FIGS. 3–5 illustrate 3 different embodiments of plasma electrodes in accordance with the invention. These embodiments are designed to minimize coupling of the rf signal applied thereto to the resistance heating means and control mechanisms associated therewith. To this end, it is preferred that the plasma electrodes be of the capacitive coupled type rather than the induction coupled type.

FIG. 3 illustrates a preferred embodiment of plasma electrodes 66, 68 in accordance with the invention. Electrodes 66 and 68 are semi-cylindrical metal electrodes concentric with and surrounding inner tube 14. A narrow gap 70 spacially separates the two electrodes. One of the electrodes is coupled to an rf generator (not shown in this view) while the other electrode is coupled to an rf ground. Application of rf energy to the electrodes in this manner creates an rf field in the region bounded by inner tube 14. This field, in turn, generates a plasma in reactant gases passing therethrough.

FIG. 4 illustrates a further embodiment of plasma electrodes in accordance with the invention. Electrodes 72 and 74 include interdigitated fingers which are integral with or welded to rings at opposite ends of the reaction volume. Interdigitated fingers then extend at least the full length of the reaction volume. The electrodes are concentric with and surround inner tube 14.

FIG. 5 illustrates a still further embodiment of the plasma electrode structure in accordance with the invention. Electrodes 76 and 78 include cylindrical rings concentric with inner tube 14 which are substantially parallel to each other. The rings are positioned in or near the heated reaction volume. One of the electrodes is coupled to an rf generator and the other is coupled to rf ground.

The following non-limiting examples illustrates use of the equipment in accordance with the invention and helps to further define applicants' preferred embodiments.

EXAMPLE I

A plurality of silicon wafers were placed in a wafer boat and the boat was, in turn, loaded into nitridation apparatus as illustrated in FIG. 1. The rf plasma electrodes were of the configuration illustrated in FIG. 3. The electrodes were made of inconel a chrome, nickel, iron alloy resistant to oxidation. Nitrogen flowed over the electrodes in the space between the two walls of the double walled reaction vessel. The reaction tube was purged with dry nitrogen and then evacuated and a flow of 25% by volume ammonia in nitrogen at a total flow rate of 100 sccm was established in the vessel. The pressure was maintained at about 32 Pa. The temperature in the reaction volume was ramped upwardly from about 650° to about 1050° at a rate of about 5° C. per minute. After the final elevated temperature was reached, 100 watts of rf power was supplied to the rf plasma electrodes to generate a nitrogen-containing plasma within the reaction volume. The nitrogen-containing plasma was allowed to react with the silicon wafers at 1050° C. for one hour. At the end of the one hour, the rf power was turned off, the ammonia flow was stopped, and the wafers were removed from the reaction vessel. The resulting silicon nitride film on the wafers was measured to be about 30 Angstroms and had a refractive index of about 2.0. The films were etched in a 10:1 mixture of $H_2O$:HF and determined to have an etch rate of about 15 Angstroms per minute in contrast to silicon dioxide which has an etch rate of about 300 Angstroms per minute.

EXAMPLE II

A plurality of silicon wafers is loaded into plasma enhanced thermal processing equipment as in Example I. The wafers are heated to about 700°–800° C. in an inert ambient, and then the ambient is changed to about 1% by volume HCl in argon. The total flow is about 200 cc/min of argon and about 2 cc/min of HCl. The pressure is maintained at about 20–50 Pa. About 100 watts of rf power is supplied to the plasma electrodes to generate an HCl plasma within the reaction volume. The rf power is continued for about 1 minute and then the HCL flow is terminated and the wafers are removed from the reaction tube. Weight loss measurements are used to determine etch rate. The wafer surfaces are inspected for surface quality. The etch process is repeated with minor variations in etchant composition, temperature and rf power to achieve an etch rate of about 100 Angstroms per minute. The etch process is similarly repeated using $CF_4$ and $SF_6$ as the etch gases.

EXAMPLE III

A plurality of silicon wafers is loaded into plasma enhanced thermal processing equipment and about 100–300 Angstroms is etched from the surfaces as in Example II. Following the etch process, the reaction volume is purged with an inert gas and the wafers are oxidized. The oxidation is carried out in a mixture of oxygen and argon at a temperature of about 500° C. to about 1100° C. and preferably between about 600° C. and 950° C. Rf power is applied to the plasma electrodes to generate an oxygen plasma in the reaction volume. Oxidation rate is adjusted by varying the oxygen concentration, oxidation temperature and rf power level.

Thus, it is apparent that there has been provided, in accordance with the invention, a plasma enhanced thermal reaction system which fully meets the objects and advantages set forth above. Although the invention has been described and illustrated with respect to specific embodiments thereof, it is not intended that the invention be limited to these illustrative embodiments. Those skilled in the art will recognize, after review of the foregoing detailed description, that variations and modifications departing from the illustrative embodiments but still falling within the scope of the invention are possible. For example, the invention has been illustrated with reference to a system for the nitridation, etching, or etching and oxidation of silicon or a silicon-bearing material, but the apparatus is equally applicable to other high temperature plasma enhanced thermal processes. For example, the apparatus and process can be used in forming mixed or sequential layers of oxide and nitride, the forming and subsequent nitridation of oxide layers, and the like. Accordingly, it is intended to include within the invention all such variations and modifications as fall within the scope of the appended claims.

We claim:

1. Apparatus for the nitridation of a silicon-bearing substrate which comprises: a double walled reaction vessel having first and second concentric walls and bounding a reaction volume; resistance heating means positioned exterior to said vessel for heating material within said vessel; plasma generating electrodes positioned between said first and second walls for generating a plasma within said reaction volume; means for controlling the ambient between said first and second walls; first means for supplying energy to said resistance heating means; and second means for supplying rf energy to said plasma generating electrodes independent of said first means.

2. The apparatus of claim 1 wherein said plasma generating electrodes comprise first and second electrodes for capacitively coupling rf energy to material within said reaction volume.

3. The apparatus of claim 2 wherein said first and second electrodes are designed to minimize coupling of said rf energy to said resistance heating means.

4. The apparatus of claim 2 wherein said first and second electrodes comprise partial cylinders concentric with said first and second walls.

5. The apparatus of claim 2 wherein said first and second electrodes comprise first and second sets of interdigitated fingers.

6. The apparatus of claim 5 wherein said reaction vessel has an elongate axis and said fingers extend parallel to said axis with said first and second sets being concentric with said first and second walls.

7. The apparatus of claim 2 wherein said first and second electrodes comprise spaced apart rings surrounding said reaction volume and concentric with said first and second walls.

8. The apparatus of claim 2 wherein said first and second electrodes comprise inconel.

9. The apparatus of claim 1 further comprising vacuum means for establishing a reduced pressure in said reaction volume.

10. The apparatus of claim 1 further comprising filters for isolating said resistance heating means from said rf energy.

11. The apparatus of claim 10 further comprising screen means for isolating said rf energy.

12. The apparatus of claim 10 wherein said thermal treatment comprises nitridation and said apparatus further comprises means for introducing nitrogen-bearing reactants to said reaction volume.

13. Apparatus for the plasma assisted thermal treatment of a substrate which comprises: a first reaction tube bounding a reaction volume; a second tube surrounding said first reaction tube; resistance heating means outside said second tube for controlling the temperature in said reaction volume; plasma electrodes positioned proximate said reaction volume between said first reaction tube and said second tube for generating a plasma in said reaction volume; means for reducing the oxidation of said plasma electrodes; and rf generating means coupled to said plasma electrode and controllable independently of said resistance heating means.

14. The apparatus of claim 13 further comprising means for isolating said rf generating means from said resistance heating means.

15. The apparatus of claim 14 wherein said means for isolating comprises low pass filters.

16. The apparatus of claim 13 wherein said means for reducing comprises flowing an inert gas over said plasma electrodes between said first reaction tube and said second tube.

17. The apparatus of claim 13 further comprising a source of etchant material for etching a workpiece positioned in said reaction volume.

18. Apparatus for the plasma enhanced thermal treatment of a semiconductor device wafer which comprises: first and second concentric quartz tubes surrounding a reaction volume adapted for receiving a plurality of semiconductor device wafers; plasma electrodes positioned between said first and second tubes about said reaction volume; rf generating means coupled to said plasma electrodes for generating a plasma in said reaction volume; means for limiting the oxidation of said electrodes; resistance heating means surrounding said first and second concentric tubes; and electrical means coupled to said resistance heating means for controlling the temperature in said reaction volume.

19. The apparatus of claim 18 further comprising means for supplying reactants to said reaction volume.

20. The apparatus of claim 19 wherein said means for supplying comprises a source of a nitrogen-bearing reactant.

21. The apparatus of claim 19 wherein said means for supplying comprises a source of an etchant material.

* * * * *